March 28, 1967 B. J. GUMM ETAL 3,311,799
SEMICONDUCTOR BARRIER LAYER SWITCH WITH SYMMETRICAL
CHARACTERISTICS ON EITHER POLARITY
Filed July 6, 1960

WITNESSES:
Wm. C. Groome
Charles L. Menzemer

INVENTORS
Brian J. Gumm and
Clifford V. H. Miles.
BY
Frederick Shapoe
ATTORNEY

United States Patent Office 3,311,799
Patented Mar. 28, 1967

3,311,799
SEMICONDUCTOR BARRIER LAYER SWITCH WITH SYMMETRICAL CHARACTERISTICS ON EITHER POLARITY

Brian J. Gumm, Watford, and Clifford V. H. Miles, Enfield, England, assignors to Westinghouse Brake & Signal Company Limited, London, England, a corporation of Great Britain Filed July 6, 1960, Ser. No. 41,083
Claims priority, application Great Britain, July 31, 1959, 26,299/59
1 Claim. (Cl. 317—235)

The present invention relates to a semiconductor device, and more particularly to a semiconductor switching device.

This application is based on British patent application 26,299/59, filed July 31, 1959, and assigned to the assignee of the present application.

Semiconductor devices may be so constructed that a current flow obtained through such a device with variation of voltage applied to the device proceeds, over a range of reverse voltages applied to the device in a smooth manner and then, when this range of values for the reverse voltage is exceeded, exhibits a discontinuity to another mode of operation of the device. In the Proceedings of the I.R.E. dated September 1956 at pages 1174 to 1182, J. L. Moll et al. reference is made to P-N-P-N transistor switches which may be regarded as exhibiting in one mode of operation a high resistance and in another mode of operation a low resistance, a negative resistance characteristic existing between the two modes, and transition from one mode to the other and vice versa being obtainable in a repeatable manner. By semiconductor switching devices it is intended to indicate semiconductor devices possessing these latter mentioned properties.

These previously prepared semiconductor switching devices have been such as to operate as switches only when current is passed therethrough in a predetermined direction.

An object of the present invention is to provide a semiconductor switching device comprising a wafer of a semiconductor material, said wafer having a central region of a first-type of semiconductivity and two outer regions of a second-type of semiconductivity disposed on opposite sides of the central region, a p-n junction between each of said outer regions and the central region, and a metallic source of minority carriers disposed upon each of the two outer regions of second-type of semiconductivity.

Another object of the present invention is to provide a semiconductor switching device comprising a wafer of a semiconductor material, said wafer having a central region of a first-type of semiconductivity and two outer regions of a second-type of semiconductivity disposed on opposite sides of the central region, a p-n junction between each of said outer regions and the central region, and a metallic source of minority carriers disposed upon the two outer regions of second-type of semiconductivity, the semiconductor device having substantially symmetrical first and third quadrant I–V characteristics.

Other objects of the present invention will, in part, be obvious, and will, in part, appear hereinafter.

Figure 1:
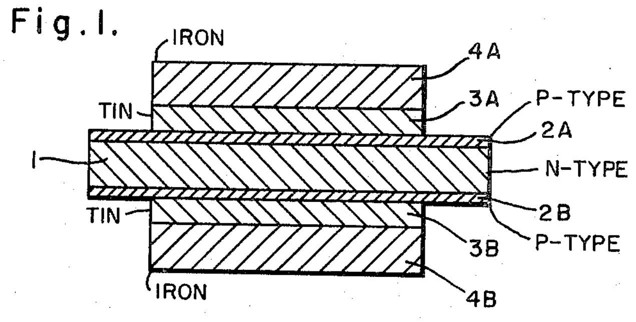
Figure 2:
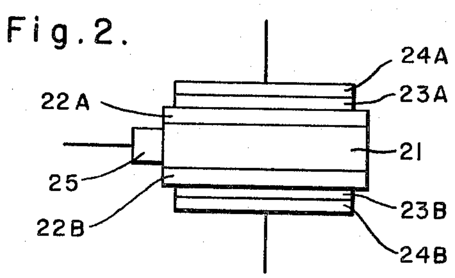
Figure 3:
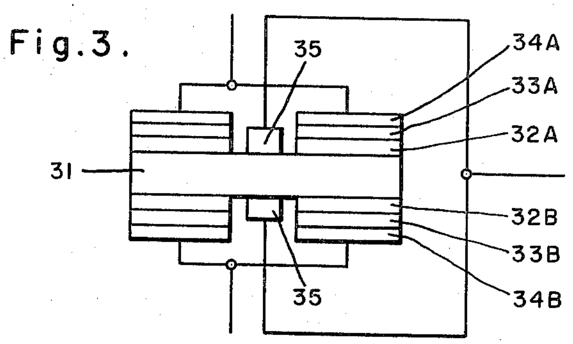

For a better understanding of the nature and objects of the invention, reference should be had to the following detailed description and drawing in which:

FIGURES 1 to 3 are side views, in cross-section, of semiconductor switching devices prepared in accordance with the teachings of this invention.

In accordance with the present invention and attainment of the foregoing objects there is provided a semiconductor switching device comprising a wafer of a semiconductor material, said wafer having a central region of a first-type of semiconductivity, and two outer regions of a second-type of semiconductivity disposed on each of the opposite sides of the central region, a p-n junction between each of said outer regions and the central region, and a metallic source of minority carriers disposed upon the two outer regions of second-type of semiconductivity. The semiconductor switching device has substantially identical first and third quadrant I–V characteristics.

For the purposes of explanation, the semiconductor switching device of this invention will be described in terms of a wafer of germanium in which the central region is of n-type semiconductivity, and the two outer regions are of p-type semiconductivity. It will be understood however, that the wafer may also be comprised of any other suitable semiconductor material, for example silicon, silicon carbide and stoichiometric III–V compounds for example gallium antimonide, gallium arsenide, gallium phosphide, indium antimonide, and indium arsenide. It will also be understood that the central region may be of p-type semiconductivity and the two outer regions of n-type semiconductivity.

The device illustrated in FIG. 1 of the accompanying drawing has a central n-type region 1 and on either side of the central n-type region are disposed in a symmetrical manner further regions as hereinafter referred to. Adjacent the central n-type region 1 and to either side of it are p-type regions 2A and 2B, respectively. Adjacent to each of the p-type regions 2A and 2B are layers of metal 3A and 3B and surmounting these metal layers are outer supporting metallic members 4A and 4B.

The central n-type region is of a single crystal of germanium of thickness .006 of an inch doped with at least one material selected from the group consisting of antimony, arsenic and phosphorus. The p-type regions 2A and 2B are each .0005 of an inch in thickness and are formed, for example, by the diffusion of at least one material selected from the group consisting of gallium, boron, aluminum and indium by solid state diffusion into the n-type region 1 of germanium. The metal layers 3A and 3B are comprised of a tin solder of thickness .005 of an inch. The surmounting metallic members 4A and 4B are provided for convenience in mounting the device in a housing in any suitable manner and in the present case they are discs of iron each .01 of an inch in thickness. The overall diameter of the central n-type region is ⅛ of an inch and the diameter of each of the other regions and layers 2A, 2B, 3A, 3B, 4A and 4B are $\frac{3}{32}$ of an inch.

The values for the thicknesses given above for the respective regions and layers of the device are approximate only, the central n-type region for example having been made of thickness ranging from .006 up to .012 of an inch.

The resistivity of the central n-type region is about 5 ohm-cms., but this may be varied and it has been found that a range of from 1 to about 10 ohm-cms. resistivity is suitable. The resistivity of the p-type regions 2A and 2B is required to be high enough to result in the injection of minority carriers, electrons in this example, from the metal contacts provided by the layers of tin solder 3A and 3B under the bias conditions existing in operation of the device. The surface concentration of the impurities in the p-type regions may be about $10^{18}$ atoms per cc. It will be appreciated that this value for the resistivity of the p-type regions is approximate only, and due to the tin solder 3A and 3B alloying into the p-type regions 2A and 2B, the aforementioned value for the resistivity of the diffused layer may be regarded as a minimum value and the resistivity of this layer may extend over a range from 0.1 to 1.0 ohm-cm.

As indicated above, the semiconductor device as illustrated in the drawings may be mounted by means of its iron discs 4A and 4B in a suitable housing.

The value for the applied voltage at which a switching device as hereinbefore described operates may be reduced by causing current to flow in the n-type region of the device through its forward bias junction. With an increase in the current flow, the switching voltage is progressively reduced. There may be provided a third contact in addition to the two contacts required for the outer discs 4A and 4B as previously described and such a third contact may be utilized to control the current flow in the central n-type region. Alternatively, or in addition, effects due to light or heat may be used to control the value of the switching voltage.

There may be provided a region in association with the central n-type region of the device for control of current flow through the central n-type region. In the embodiment of the invention illustrated in FIG. 2 control of a current flow in a central n-type region indicated by reference numeral 21 is obtained through a contact 25 to the n-type region 21. The contact 25 is additional to two contacts 24A and 24B affixed to metal layers 23A and 23B, respectively. This additional contact 25 may be made operative to provide a flow of gate current through the central n-type region 21 by connection of the contact 25 to a source (not shown) of a trigger current which may be of pulse form. The contact 25 may be comprised of an n-type solder such as tin doped with at least one doping material selected from the group consisting of arsenic, antimony or phosphorus. The concentration of the doping impurity in the contact 25 may be made such that the contact 25 forms a region of N+ semiconductivity at the innerface between the contact 25 and n-type region 21 of the device. The contact 25 may be disposed to either lateral side of the central region 21.

The embodiment illustrated in FIG. 3 has a central n-type region indicated by reference numeral 31 with p-type regions 32A, 32B, metal layers 33A, 33B, and contacts 34A and 34B formed on each side of the longitudinal axis of the construction. In this construction, a contact indicated by reference numeral 35, which forms an N+ region of semiconductivity at the innerface with the central n-type region 31, is formed as an axial projection on either face of the central region 31. To provide such a construction the p-type regions 32A, and 32B may have their axial areas removed by selective chemical etching, using a mask or by localized electrolytic etching and an N+ region then formed in the so removed axial regions. The contacts 35 associated with the central n-type region 31 can be utilized to control current flow through the central n-type region 31.

A switching device as hereinbefore described may be arranged to operate through the terminals connected to the constituents in a circuit such that a voltage pulse applied to these terminals of value greater than the switching voltage requires to be applied to the circuit for switching to take place. In an alternative arrangement a bias voltage may be constantly applied and a pulse of voltage greater than the difference between switching voltage and bias voltage is required before switching takes place. In both cases switching off takes place when the applied voltage decreases to a value below the sustaining voltage and with alternating voltages, switching off occurs in every successive half cycle.

We claim as our invention:

A semiconductor switching device comprising a wafer of a semiconductor material, said wafer having a central region of a first-type of semiconductivity, said central region having a top surface and a bottom surface, a first region of a second-type of semiconductivity disposed upon the top surface of the central region about the periphery thereof, a p-n junction between the first region and the central region, a second region of a second-type of semiconductivity disposed upon the bottom surface of the central region about the periphery thereof, a p-n junction between the second region and the central region, a metallic source of minority carriers affixed to the first and second regions of second-type semiconductivity, an electrical contact affixed to each metallic source of minority carriers, and one electrical contact affixed to the top surface of the central region and one electrical contact affixed to the bottom surface of the central region.

References Cited by the Examiner

UNITED STATES PATENTS

| | | | |
|---|---|---|---|
| 2,623,102 | 12/1952 | Shockley | 317—235 |
| 2,744,970 | 5/1956 | Shockley | 317—235 |
| 2,852,677 | 9/1958 | Shockley | 317—234 |
| 2,870,345 | 1/1959 | Overbeek | 307—88.5 |
| 2,905,873 | 9/1959 | Ollendorf et al. | 317—235 |
| 2,909,453 | 10/1959 | Losco et al. | 148—1.5 |
| 2,927,204 | 3/1960 | Wilhelmsen | 317—235 X |
| 2,944,165 | 7/1960 | Stuetzer | 307—88.5 |
| 2,953,693 | 9/1960 | Philips | 307—88.5 |
| 2,966,434 | 12/1960 | Hibberd | 148—33 |
| 2,980,810 | 4/1961 | Goldey | 307—88.5 |
| 2,984,752 | 5/1961 | Giacaletto | 317—235 |

JAMES D. KALLAM, *Primary Examiner.*

SAMUEL BERNSTEIN, DAVID J. GALVIN, JOHN W. HUCKERT, *Examiners.*

A. B. GOODALL, A. S. KATZ, *Assistant Examiners.*